United States Patent [19]
Hornisch

[11] Patent Number: 5,832,963
[45] Date of Patent: *Nov. 10, 1998

[54] SHAFTLESS ROLLER FOR LEAD FORMING APPARATUS

[76] Inventor: Frank Hornisch, Toa Payoh Central Block 178 #03-204, Singapore, Singapore, 310178

[ * ] Notice: This patent issued on a continued prosecution application filed under 37 CFR 1.53(d), and is subject to the twenty year patent term provisions of 35 U.S.C. 154(a)(2).

[21] Appl. No.: 759,069

[22] Filed: Dec. 2, 1996

[30] Foreign Application Priority Data

Dec. 5, 1995 [SG] Singapore ............................ 9502021-0

[51] Int. Cl.[6] .................................................... B21F 45/00
[52] U.S. Cl. ............................................................ 140/105
[58] Field of Search .............................. 72/236, 212, 213, 72/463; 140/105

[56] References Cited

U.S. PATENT DOCUMENTS

| | | | |
|---|---|---|---|
| 1,513,565 | 10/1924 | Somersall | 72/213 |
| 2,527,725 | 10/1950 | Hartman | 72/463 |
| 3,613,427 | 10/1971 | Haddon | 72/212 |
| 3,914,972 | 10/1975 | Gillette et al. | 72/212 |

FOREIGN PATENT DOCUMENTS

| | | | |
|---|---|---|---|
| 3629270 | 3/1987 | Germany | 72/212 |
| 194341 | 8/1989 | Japan | 140/103 |

*Primary Examiner*—Lowell A. Larson
*Attorney, Agent, or Firm*—Lawrence Y. D. Ho

[57] ABSTRACT

A shaftless roller for lead forming apparatus for scratch-free, precision forming of leads on a semiconductor device. The shaftless roller includes a semi-cylindrical cavity disposed in the lead forming apparatus. A cylindrical rod is rotatably fitted into the cavity such that more than fifty percent but less than one hundred percent of the rod is inside the cavity. The roller further includes a plurality of slots leading into the cavity for facilitating self-cleaning action, and an air passage adapted for delivering pressured air into the cavity to serve as air bearing for the cylindrical rod.

20 Claims, 15 Drawing Sheets

ROLLER

SHAFT    ROLLER

SHAFTED ROLLER    LEAD

SHAFTLESS ROLLER FOR LEAD FORMING APPARATUS

FIELD OF THE INVENTION

This invention relates to a shaftless roller which is disposed in a lead forming apparatus for facilitating precision forming of fine-pitch leads on a semi-conductor device while avoiding scratches and other nonconformities on the leads.

BACKGROUND OF THE INVENTION

It is well known to those skilled in the art the various methods of forming leads on semiconductor packages. A popular method uses a forming punch die or cam type punch as shown in FIG. 1A and FIG. 1B. Although this method has been available for some time and is currently widely used, it causes the leads to brush against the forming die to produce highly undesirable scratches on the leads, and resulting in the removal of tin or other important metal coating which is necessary to facilitate solid soldered contacts. This and other problems commonly associated with the conventional punch or cam forming are generally known to those skilled in the art and are described in detail in, among others, U.S. Pat. No. 5,375,630 (Kim).

The formation of scratches on the leads is a serious problem in the semiconductor industry. Hence, many design improvements have been made to lead forming apparatus to overcome this problem. As a result, a new lead forming process incorporating rollers—hence the term "roller forming"—has been developed. Unlike the conventional cam or punch forming where the leads of a semiconductor device brush against the lead forming apparatus, the basic principle of roller forming is to eliminate friction between the leads and the lead forming apparatus by strategically placing the rollers where the leads most often make contact such that relative movement is reduced or completely eliminated.

A number of lead forming apparatus embodying this principle are currently available. The U.S. Pat. No. 5,074,139 (Elliot) suggests a roller forming method using a plurality of roller sets. This method bends the leads into the desired shape by passing a lead frame holding a plurality of semiconductor components through a series of specially-shaped rollers which progressively bend the leads into the final shape. This method, however, is limited to forming the leads of a dual in-line semiconductor package (DIP) and cannot form the leads of a quad flat semiconductor package (QFP). Likewise, the rollers which are specially shaped for this method cannot be used generally in conjunction with other roll forming designs.

This limitation was overcome in U.S. Pat. No. 5,376,630 (Kim) which describes a roller forming method for forming the leads on a QFP. As shown in FIGS. 2A and 2B, Kim's method utilizes a form roller at the end of a punch press to shape a plurality of leads into the desired shape. Another roller forming method for a QFP is described in U.S. Pat. No. 5,199,469 (Ishihara), see FIG. 3A, where a pair of rollers is rotatably attached to a punch plate to form the leads. Here, the leads, which are fixedly held on a bending die, are bent along the sides of the bending die as the rollers are lowered. Another, but similar, method is shown in FIG. 3B where only a single roller is used.

Although roller forming does alleviate some of the problems commonly associated with the conventional cam or punch type forming, the prior art designs use "traditional" rollers which are not particularly suited for lead forming of semiconductor devices. As shown in FIG. 5, a traditional roller 5 has a main cylindrical rod 12 supported by a shaft 16 which is fitted into a bore or a hole 17 of a support 14 at opposite ends. The rollers with this "shafted" design supports the cylindrical rod on its shaft which is supported only at its ends—it is not supported along the entire length of the shaft. Hence, the roller cannot tolerate much force without deforming out of shape, particularly given the small radius required of the roller for this type of application.

An attempt can be made to avoid this problem by increasing the roller radius, or in the alternative, shortening the roller. However, for lead forming applications for a semiconductor device, a larger radius is problematic because the leads are often very small and demand a tight tolerance. It is typical to require a tolerance on the finally formed package of 0.05 mm which includes package warpage, allowed burr, and bounce-back effects. It is particularly problematic when the rollers are placed at the end of a punch or cam press, such as in Kim, where the radius of the rod determines the radius of the formed leads. Because tight tolerances are a must, it is highly undesirable to increase the roller size at the expense of precision or accuracy. While shortening of the roller may be another option, a shorter roller may prevent the resulting apparatus from accommodating semiconductor packages with very high lead count—hence, limiting the range of applications. To consistently attain precision, accuracy and versatility, the roller must be capable of supporting a long rod with a small radius and be able to withstand sufficient force without deforming. The currently available traditional rollers, unlike a shaftless roller, cannot easily meet these important criteria.

This shortcoming of the traditional roller was partially addressed in the shafted roller design of FIG. 6. This design attempted to overcome the bending problem by having a series of short cylindrical drums 18 in a multi-slotted holder 20. Each slot is accompanied by a pair of shaft supports 19 and hence has gaps between the drums. To properly utilize this type of roller, the semiconductor leads must be spaced such that they land on the drums and not in the gaps. However, because there is finite limit to how thin the gaps can be made, this roller is not suitable for forming certain types of semiconductor devices with very fine-pitch leads.

A modified design of the roller in FIG. 6 is shown in FIG. 6A where the roller having a continuous roller surface has multiple matching slots to accommodate the gaps. By having a continuous surface, this design avoids the shortcoming described above in reference to the roller in FIG. 6. However, as shown in FIG. 6A.1, this design does not allow the roller to rotate the full 360 degrees. Hence, the roller must be cumbersomely "recycled", i.e., rotated back into its original position each time the roller is used.

In addition to the shortcomings stated above, a shafted roller, as compared to a shaftless roller, generally has number of other disadvantages. Mainly, a roller with a shaft requires more parts, and hence more space. Because space is constrained in a semiconductor lead forming process, additional bulk is highly undesirable. One consequence of this shortcoming is that a shafted roller cannot easily facilitate a one-step forming of all four sides of a QFP. As illustrated in FIG. 4, a roller with a shaft on sides A and B must provide for the shaft support which occupies the space near the adjacent leads, the space within which the rollers of sides C and D need to occupy. Hence, only two rollers may be fitted into the design at one time. Therefore, only two sides of the QFP package can be formed in one stage, and two separate steps are required to form all four sides of a QFP package.

The two-step formation of the leads, as compared to a one-step, has number of disadvantages. First, the throughput is reduced since two steps inevitably take longer to execute than a single step. In addition, the lead forming apparatus incurs more wear and tear as it is required the repeat the movement for each QFP. Moreover, because each step cannot be reproduced exactly as the one previous, additional tolerances are introduced.

Yet another shortcoming of a conventional shafted roller is that the roller is generally not as stable or reliable, and requires more maintenance. In addition, because a shafted roller is supported by a shaft, it is not capable of optimally utilizing air bearing which can help reduce friction and remove debris.

OBJECT OF THE INVENTION

It is therefore, an object of the present invention to provide a shaftless roller for a lead forming apparatus and a method of using the same for precisely forming fine-pitch leads on semiconductor packages and to help overcome the shortcomings stated above for conventional rollers while also eliminating some of the problems generally associated with conventional cam or punch type forming.

SUMMARY OF THE INVENTION

The present invention is a shaftless roller which is particularly suited for a lead forming apparatus for forming fine-pitch leads on a semiconductor device while avoiding scratches and other deformities on the leads. The roller is integrated into the lead forming apparatus where a semi-cylindrical cavity is selectively disposed in the apparatus. A cylindrical rod is rotatably fitted into the cavity such that more than fifty percent but less than one hundred percent of the rod is inside the cavity.

In the preferred embodiment of the present invention, the shaftless roller includes a plurality of slots leading to the cavity to help reduce friction between the cylindrical rod and the cavity surface and to facilitate self-cleaning by providing an opening for dirt and other debris to escape. The roller further includes an air passage which provides a channel to the semi-cylindrical cavity such that pressurized air can create an air bearing for the rod. In addition, the shaftless roller is modularized such that a section of the lead forming apparatus containing the cavity and the rod can be removed and replaced.

BRIEF DESCRIPTION OF THE DRAWINGS

FIG. 6A.1 (Prior Art) is a side sectioned view of the roller in FIG. 6A.

FIG. 9D.1 is a side sectioned view of the roller in FIG. 9D.

DETAILED DESCRIPTION OF THE INVENTION

Figure 7:
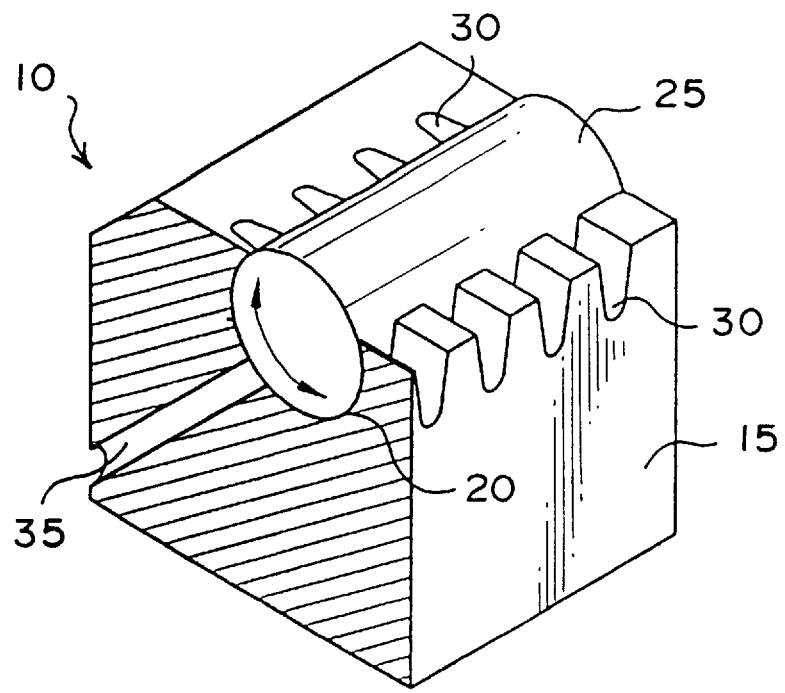
FIG. 7 is an elevational perspective view of the modularized shaftless roller with self-cleaning slots and an air passage.
Figure 8:
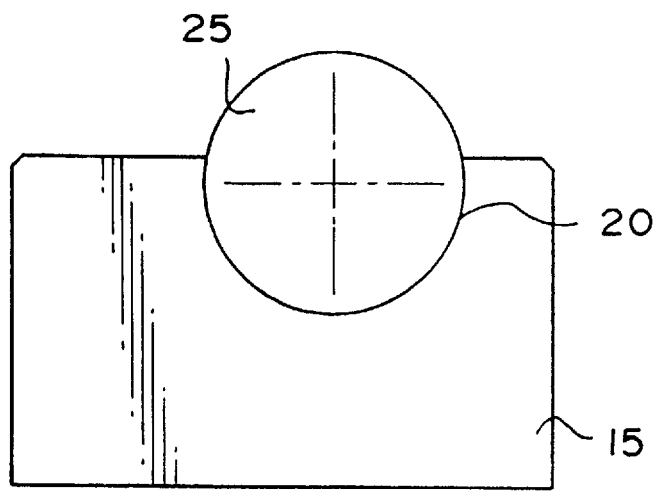
FIG. 8 is a side view of the shaftless roller in FIG. 7.

FIG. 7 illustrates the preferred embodiment of the present invention where the shaftless roller for a lead forming apparatus is modularized such that a selected section of the lead forming apparatus containing the elements of the roller may be removed and replaced. The shaftless roller 10 of FIG. 7 includes a modular section 15 and a semi-cylindrical cavity 20 disposed in the modular section 15. A cylindrical rod 25 is rotatably fitted into the cavity 20 such that more than fifty percent but less than one hundred percent of the rod 25 is inside the cavity 20. FIG. 8 illustrates the preferred embodiment where approximately sixty percent of the cylindrical rod 25 is disposed inside the cavity 20. A plurality of slots 30 is disposed in the modular section 15 to help reduce friction between the cylindrical rod 25 and the inner surface of the cavity 20 and to facilitate self-cleaning by providing an opening for dirt and other debris to escape. An air passage 35 provides a channel to the cavity 20. Pressurized air can be delivered into the cavity 35 to create an air bearing for the cylindrical rod 25 to reduce friction and to force out dirt through the slots 30.

It should be understood by those skilled in the art that a multitude of embodiments of the present invention is possible. For instance, while the slots and the air passage are the preferred features, the shaftless roller may only have one of the features or none at all without unduly affecting its overall performance. For instance, if pressurized air is not easily available, it may be desirable to omit the air passage from the roller design while leaving the slots intact. In addition, while it is preferred that more than fifty percent of the cylindrical rod be placed in the semi-cylindrical cavity, it is possible to have an embodiment where less than fifty percent is inside the cavity. Furthermore, though it is preferred that the shaftless roller have a modularized design, the shaftless roller may be completely integrated into the lead forming apparatus in areas where, for instance, it may be cumbersome or difficult to remove the roller. It is, therefor, up to the particular user to incorporate the various features into the shaftless roller to match the given circumstance.

Figure 9A:
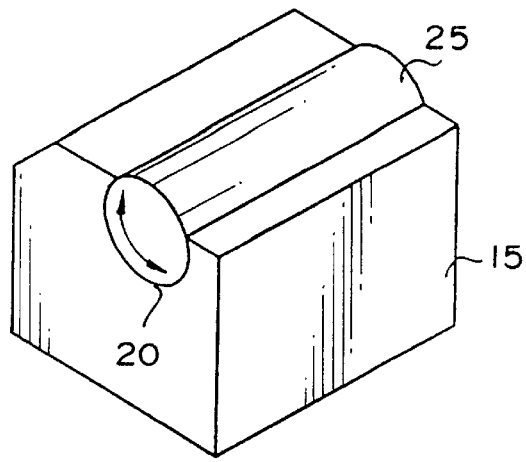
FIG. 9A is an elevational perspective view of a shaftless roller without the self-cleaning slots and the air passage.
Figure 9B:
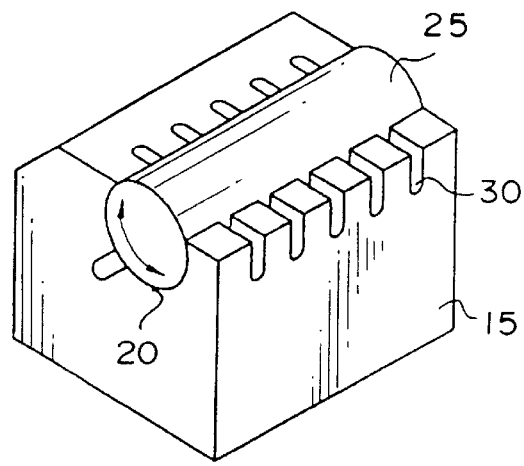
FIG. 9B is an elevational perspective view of a shaftless roller with the self-cleaning slots.
Figure 9C:
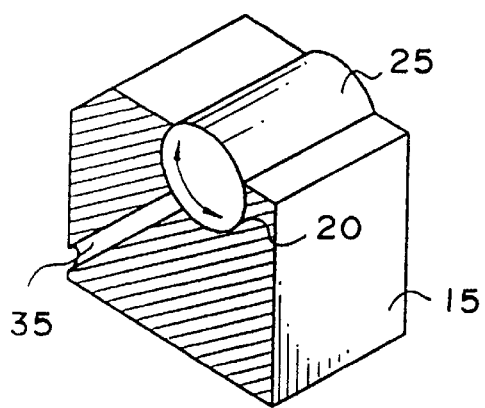
FIG. 9C is an elevational perspective view of a shaftless roller with the air passage.

As a way of illustrating these possibilities, FIGS. 9A, 9B, 9C and 9D show the various embodiments. It should be appreciated, however, that the figures are presented here for illustration purposes only and should not be construed as a limitation on the present invention. In FIG. 9B, the modularized shaftless roller includes only the slots 30 while roller in FIG. 9C includes only the air passage 35. The modularized roller in FIG. 9A, on the other hand, has neither the air passage nor the self-cleaning slots.

Figure 9D:
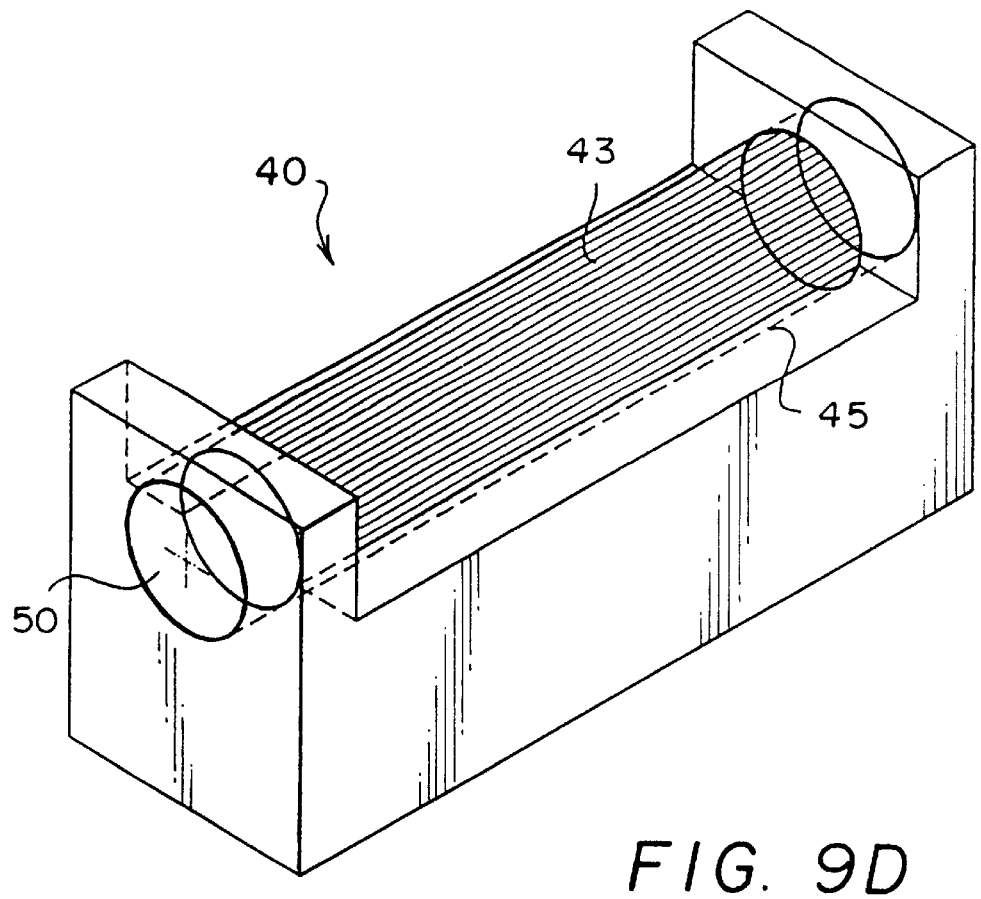
FIG. 9D is an elevational perspective view of a shaftless roller with less than fifty percent of the cylindrical rod disposed inside the cavity.
Figures 1, 9D:
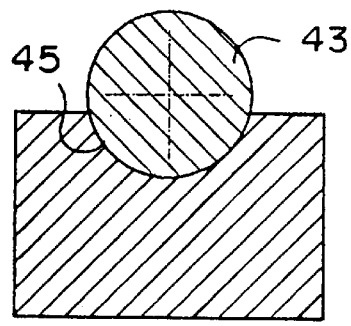

In FIG. 9D and FIG. 9D.1, a modularized shaftless roller 40 is shown where less than fifty-percent of the cylindrical rod 43 is inside the semi-cylindrical cavity 45. Although the roller 40 in FIG. 9D.1 has the cylindrical rod 43 fitted into a hole 50 at each end of the rod 43 to prevent the rod from falling out of the cavity, a restraint is not necessary where the roller is used in a lead forming apparatus with very little vibration and other movement. Also, the rod may be prevented from falling out via other means, such as magnets, wires, fasteners, etc., so long as the rod is able to rotate relatively freely.

The shaftless roller can be fabricated from various materials which are well known to those skilled in the art. Although the rollers will generally be made out of metal, other materials such as plastic, rubber, and ceramic can be used as well. Ceramic, in particular, has the advantage of providing a self-lubricating effect, where the roller may not need any additional lubricating agent such as oil or grease. A combination of materials can also be used to make the roller, where, for instance, a metal roller is selectively coated with ceramic or some other friction-reducing material.

Figure 10:
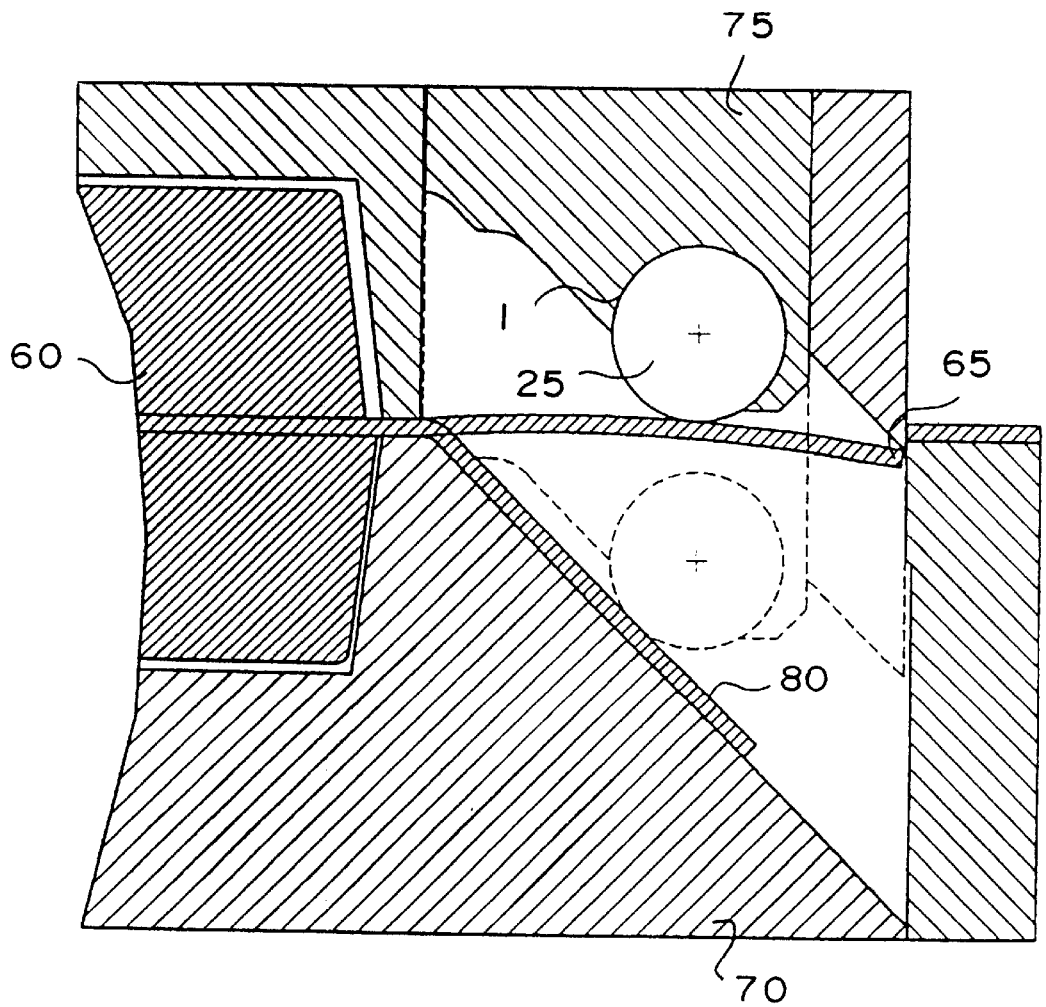
FIG. 10 is a partially sectioned side view of the shaftless roller disposed in a pre-forming apparatus illustrating the pre-forming process.
Figure 11:
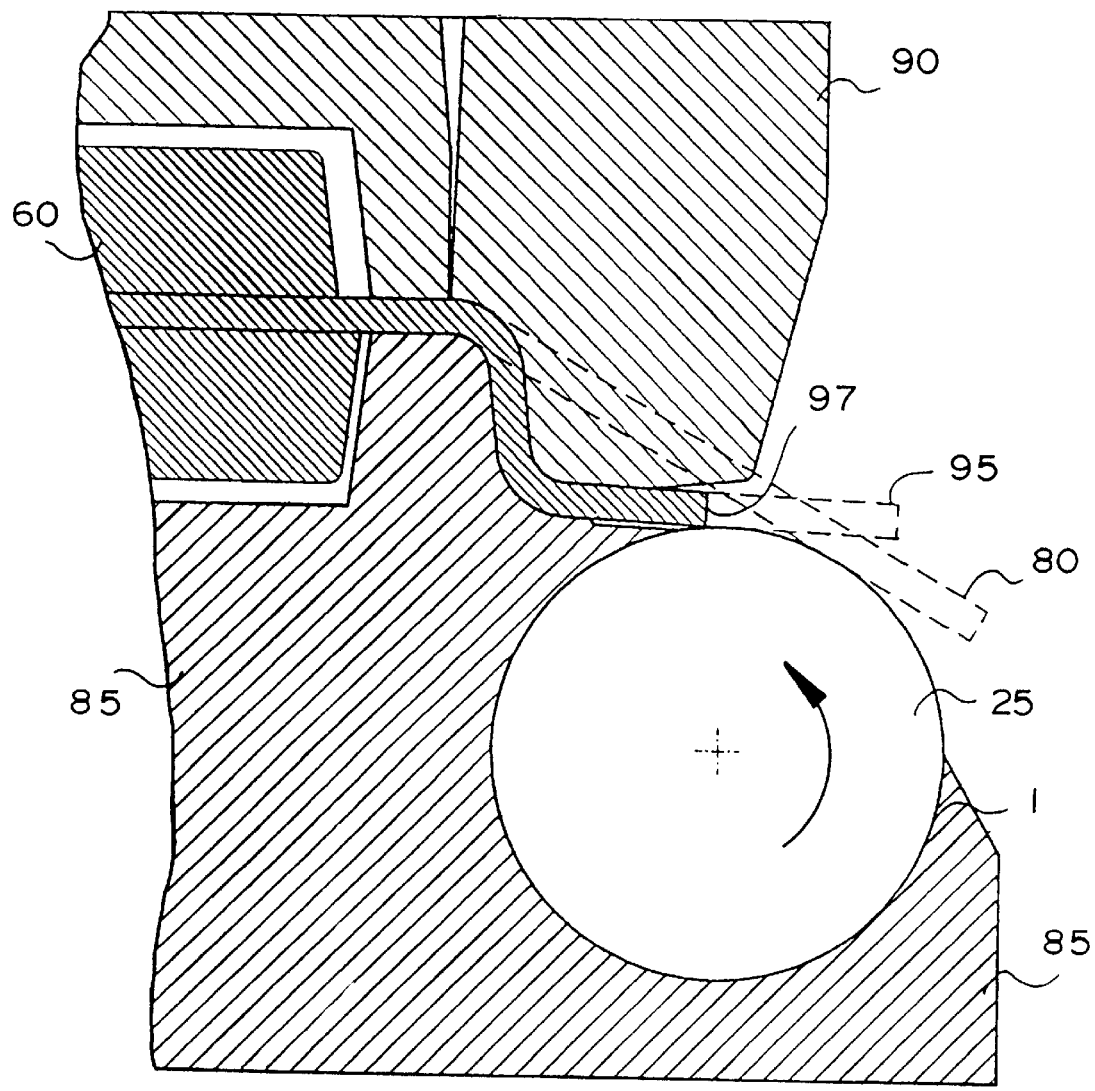
FIG. 11 is a partially sectioned side view of the shaftless roller in a cam forming apparatus illustrating the final lead forming process.
Figure 12:
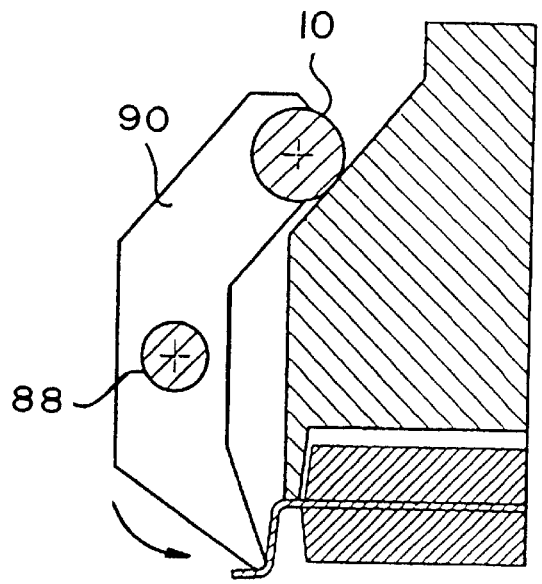
FIG. 12 is a side plan view illustrating the method of utilizing a shaftless roller in a cam forming apparatus.

The shaftless roller may be applied in multitudinous ways in a lead forming apparatus for facilitating lead forming. Generally, the roller should be strategically positioned in the apparatus where friction between semiconductor device leads and the lead forming apparatus is desirably avoided. The FIGS. 10, 11, 12 illustrate three methods for incorporating a shaftless roller in a lead forming process. It should be appreciated, however, that while FIGS. 10, 11, 12 illustrate what the inventor considered to be the preferred method of using the shaftless roller, they are shown here for illustration only and should not be deemed to be the only ways the shaftless rollers may be utilized in the lead forming process.

In FIG. 10, the shaftless roller is used in a pre-forming stage in the lead forming process. Pre-forming is a well-known process where the leads are formed to an intermediary shape in preparation for the final forming. Here, the semiconductor device 60 having a plurality of unformed leads 65 is fixedly positioned in a forming die 70. The shaftless roller 1 having a cylindrical rod 25 long enough to accommodate the semiconductor device 60 is rotatably disposed in a punch press 75 with a portion of the cylindrical rod 25 protruding out from the press. The punch press 75 is lowered until the leads 65 are bent into the desired angle. For illustration purposes, FIG. 10 shows a pre-forming angle of approximately forty-five degrees for the leads at position 80. However, the optimum angle can vary for each package depending on the package thickness and the length of the leads.

In FIG. 11, the shaftless roller is used in the final forming stage where the leads of a semiconductor device is bent into the final shape. Here, the semiconductor device 60 having a plurality of pre-formed leads 80 is fixedly positioned in the forming die 85. The shaftless roller 1 having a cylindrical rod 25 long enough to accommodate the semiconductor device 60 is rotatably disposed in the forming die 85 with a portion of the cylindrical rod 25 protruding out from the forming die 85. As the cam press 90 is moved into the final position, the pre-formed leads 80 move frictionless into position 95 and eventually to the final formed position 97. While in this illustration, the leads of the semiconductor device were pre-formed before the final forming stage, the shaftless roller may also be utilized without the pre-forming process.

Figure 12A:
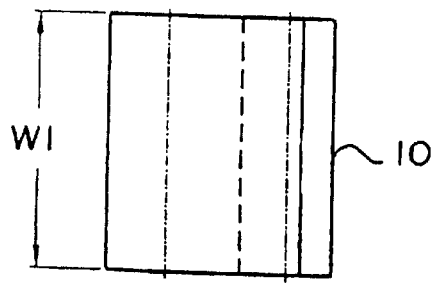
FIG. 12A is a top plan view of the shaftless roller in FIG. 12.
Figure 12B:
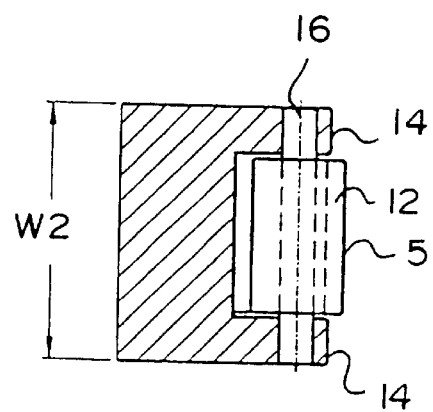
FIG. 12B is a top plan view of a shafted roller in a cam press.

In FIGS. 10 and 11, the shaftless roller was positioned where the leads of the semiconductor device make contact with the lead forming apparatus. However, the shaftless roller may also be disposed in other parts of the apparatus and benefit from the shaftless design. For instance, FIG. 12 illustrates one such situation where the shaftless roller 10 is placed in the cam press 90 to control the path of the cam as it pivots around the cam shaft 88 form the leads. As shown in FIG. 12A, the shaftless design allows the roller 10 to be equal to or greater than the width of the cam (represented by the letter "w1"), and thereby providing stability to the cam movement. In contrast, the shafted roller 5 of FIG. 12B requires a support 14 at each end of the shaft 16, and thus the roller rod 12 must necessarily be narrower than the cam width (represented by the letter "w2"). Hence, unlike the cam utilizing the shaftless roller, there is room for the cam to "wobble" and the overall stability is reduced.

Figures 1, 1A:
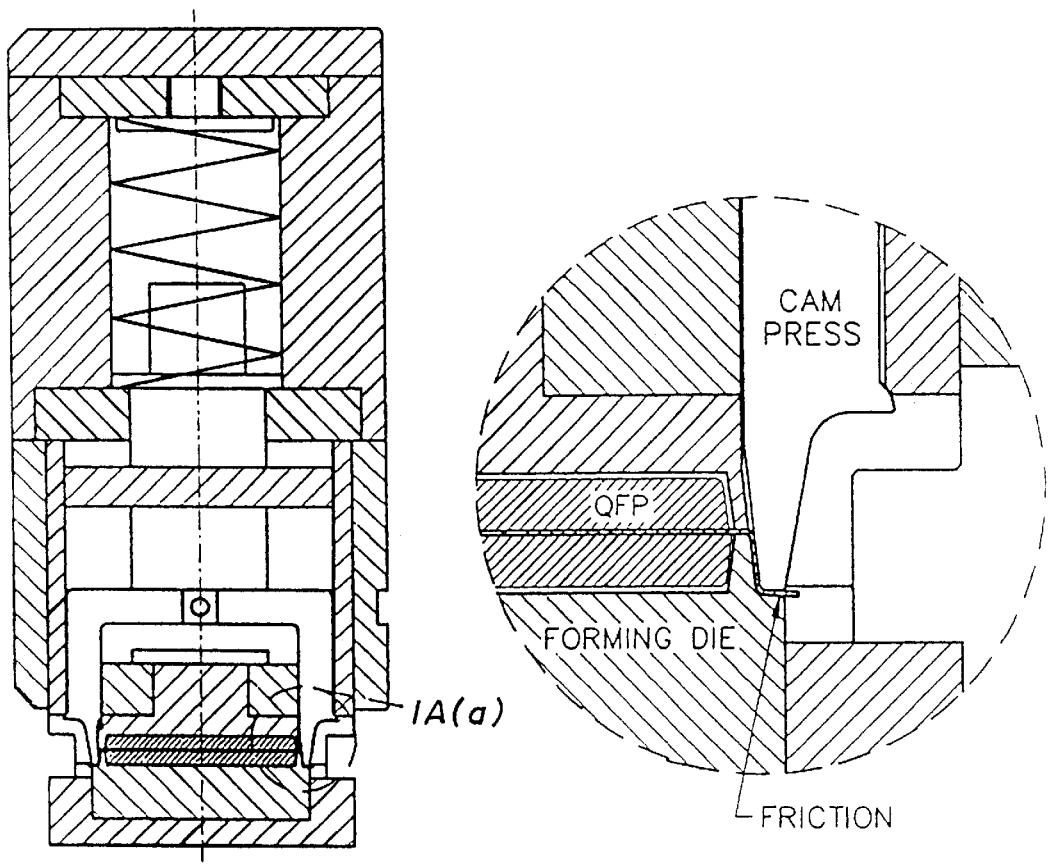
FIG. 1A (Prior Art) is a side view of a cam-type lead forming apparatus with an enlarged view of the lead forming area.
Figures 1, 1B:
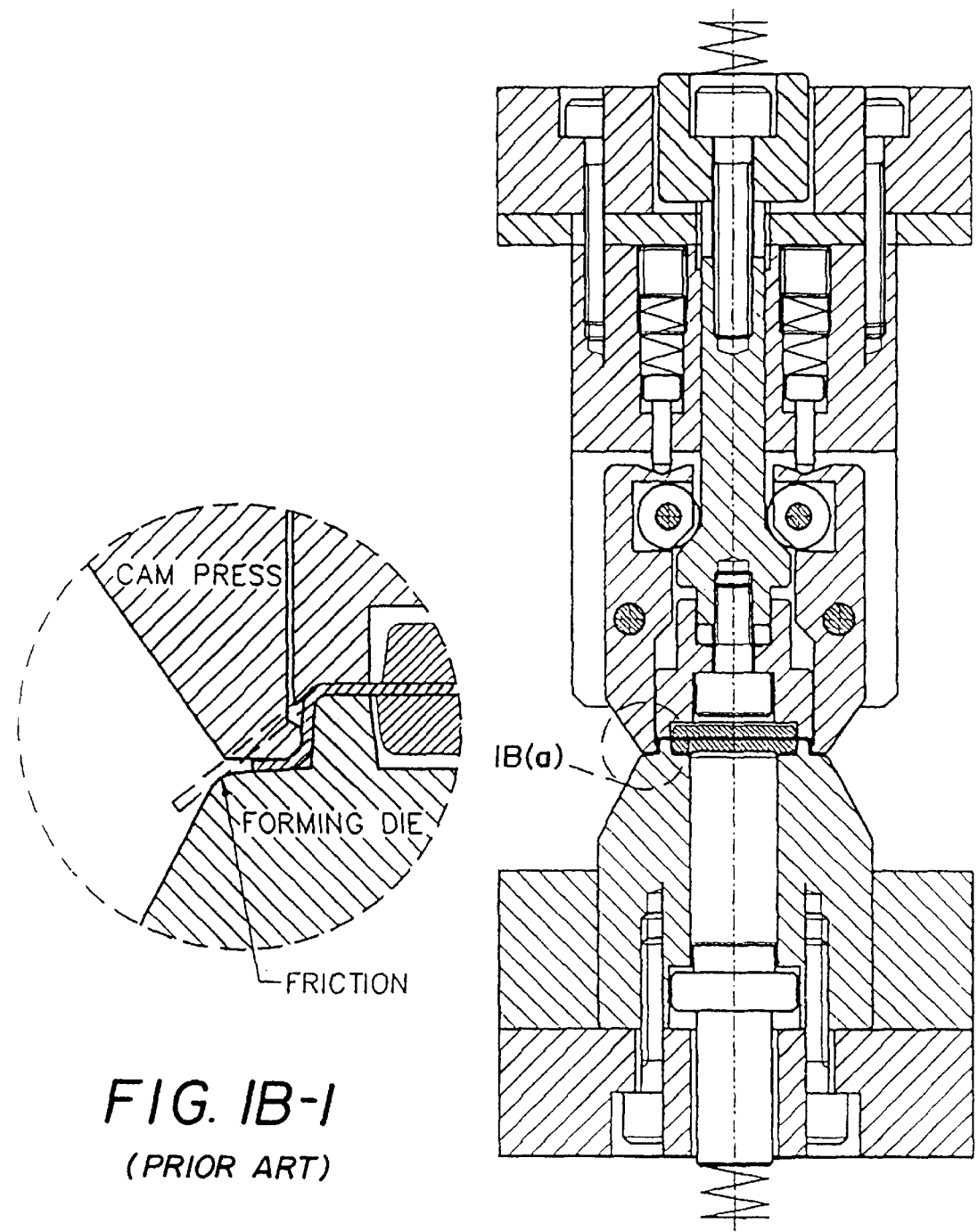
FIG. 1B (Prior Art) is a side view of a cam-type lead forming apparatus with an enlarged view of the lead.
Figure 2A:
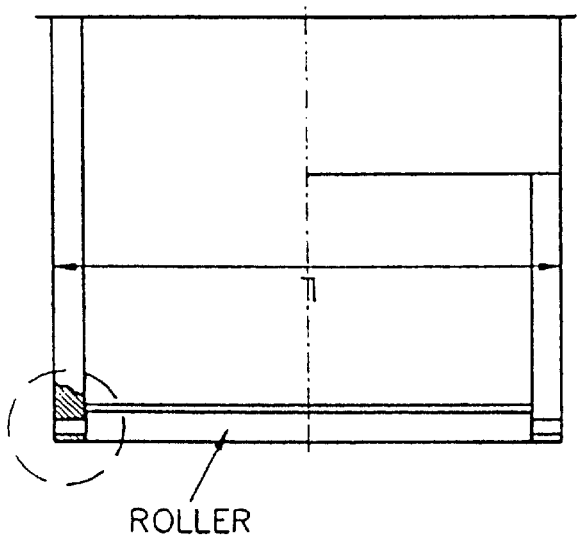
FIG. 2A (Prior Art) is an isolated front view of a punch press incorporating a shafted roller with an enlarged view of the roller.
Figures 1, 2A:
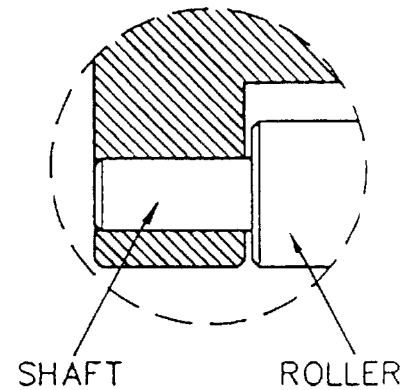
Figure 2B:
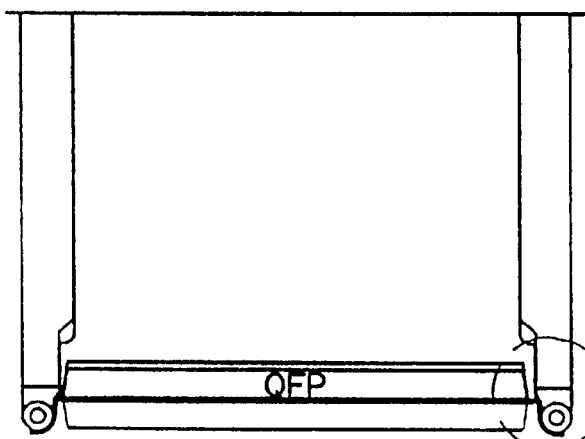
FIG. 2B (Prior Art) is a isolated side view of the punch press in FIG. 2A.
Figures 1, 2B:
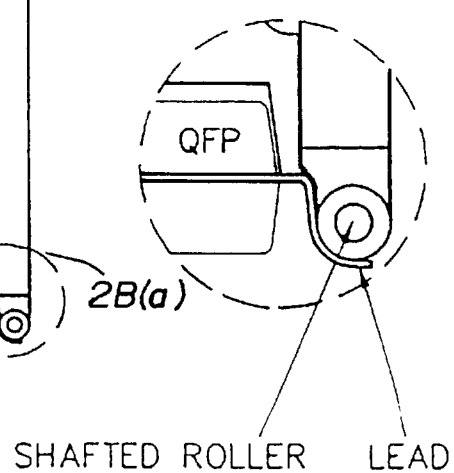
Figure 3A:
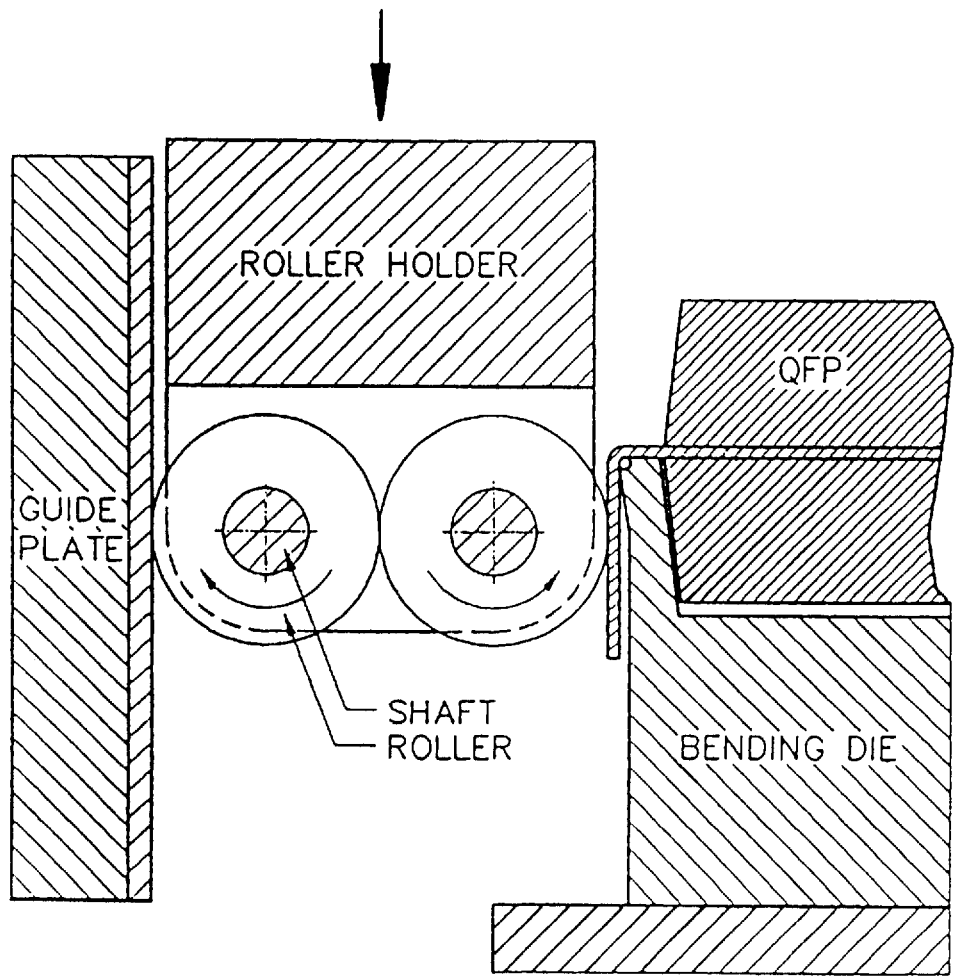
FIG. 3A (Prior Art) is a side view of an exterior lead forming device which uses a pair of rollers.
Figure 3B:
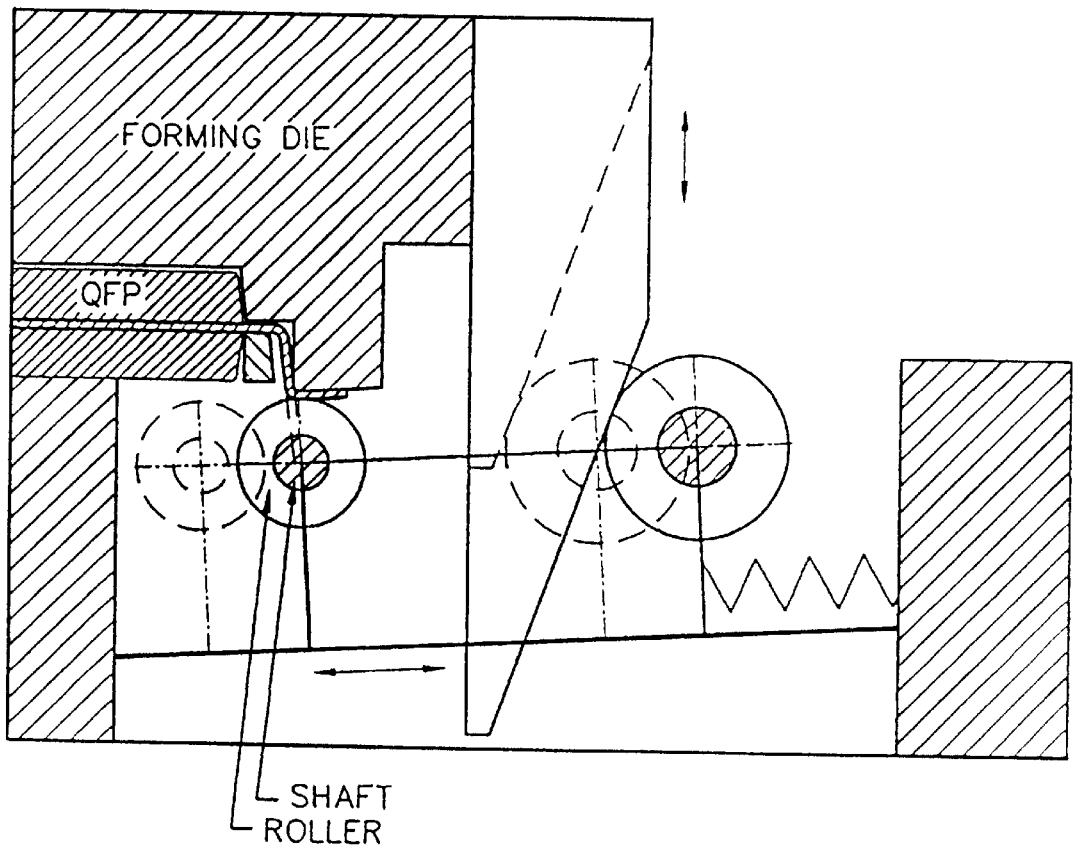
FIG. 3B (Prior Art) is a side view of a cam driven roller mechanism.
Figure 4:
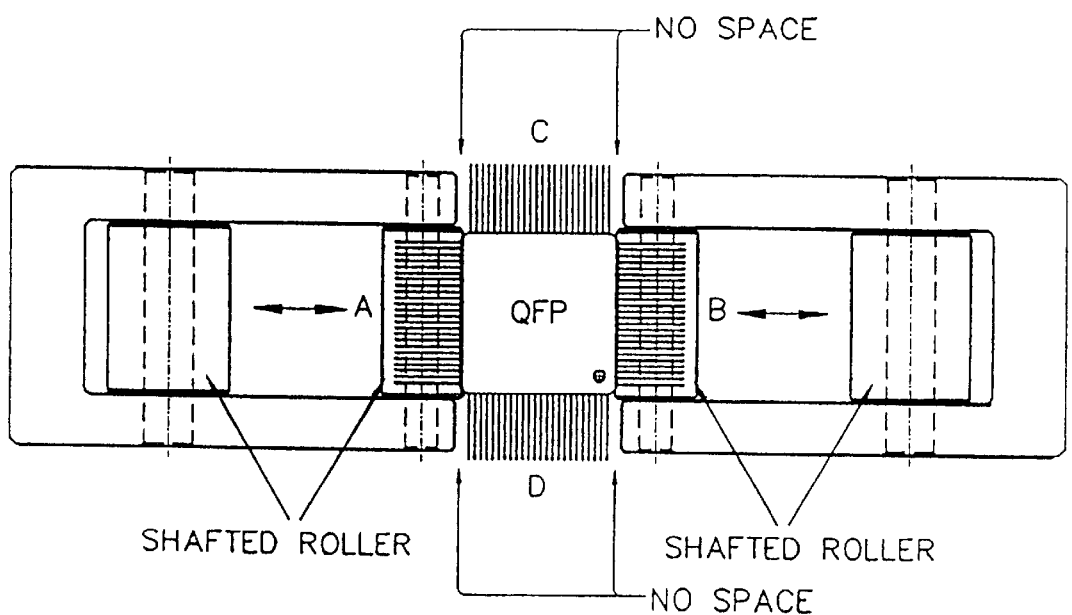
FIG. 4 (Prior Art) is a plan view illustrating the use of shafted rollers in forming the leads of a QFP semi-conductor package.
Figure 5:
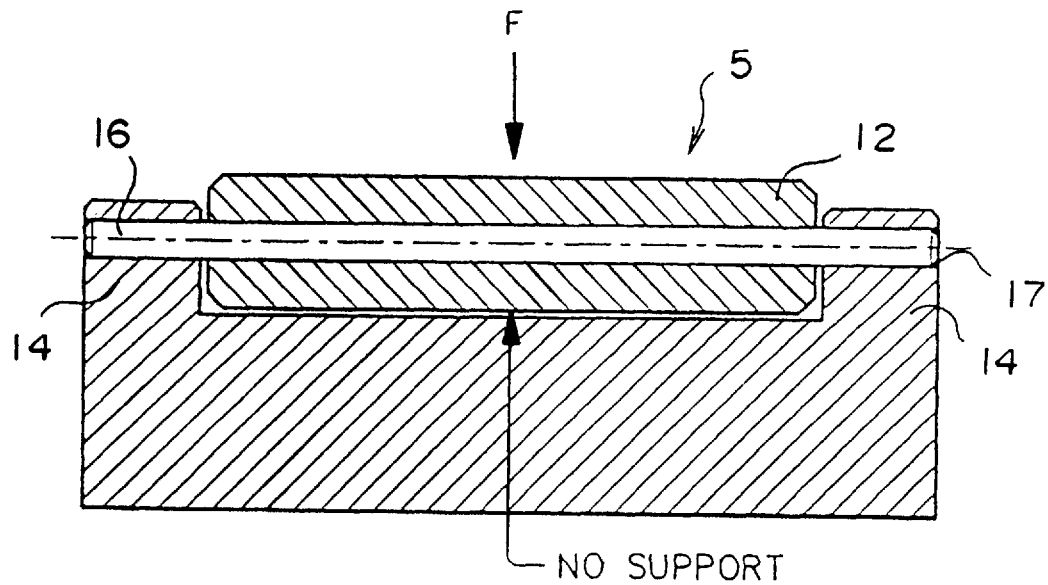
FIG. 5 (Prior Art) is a front sectioned view of a conventional roller with a shaft.
Figure 6:
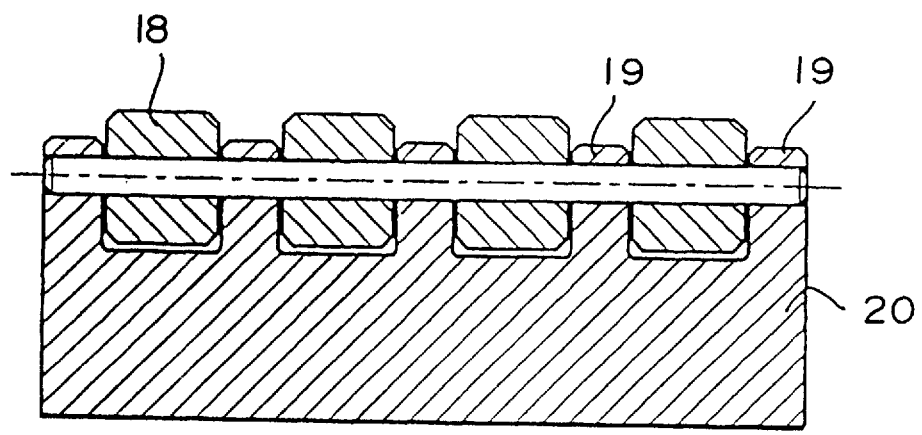
FIG. 6 (Prior Art) is a front sectioned view of a roller with a multi-slotted holder.
Figure 6A:
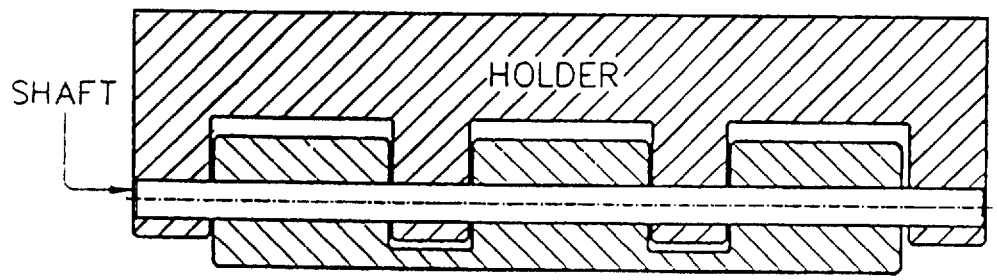
FIG. 6A (Prior Art) is a front sectioned view of a multi-slotted roller having a continuous roller surface.
Figures 1, 6A:
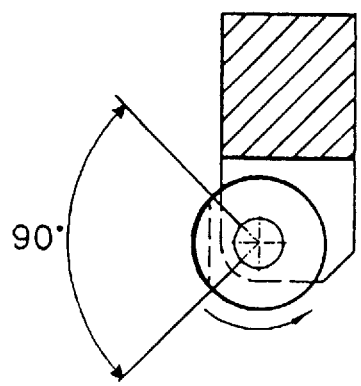
Figure 13:
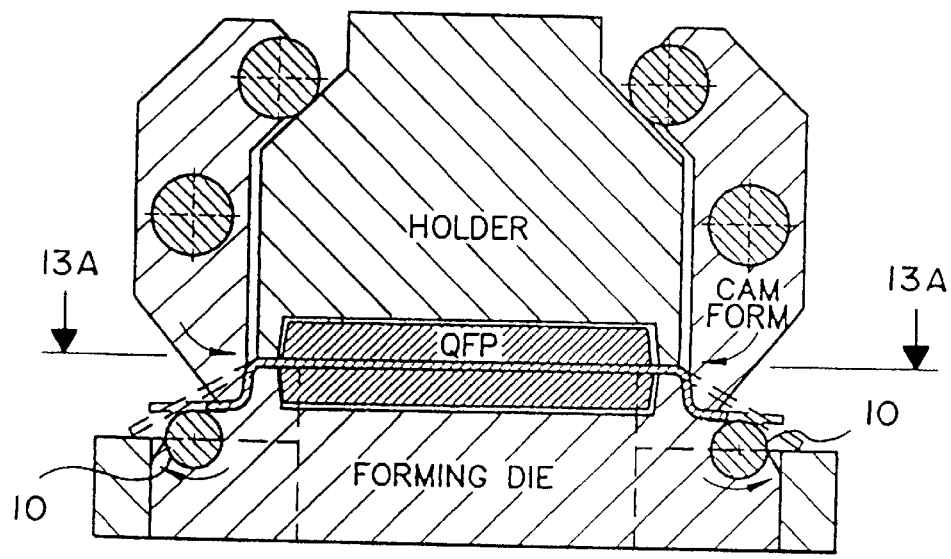
FIG. 13 is a side plan view of a single-stage cam forming apparatus for forming leads on a QFP.
Figure 13A:
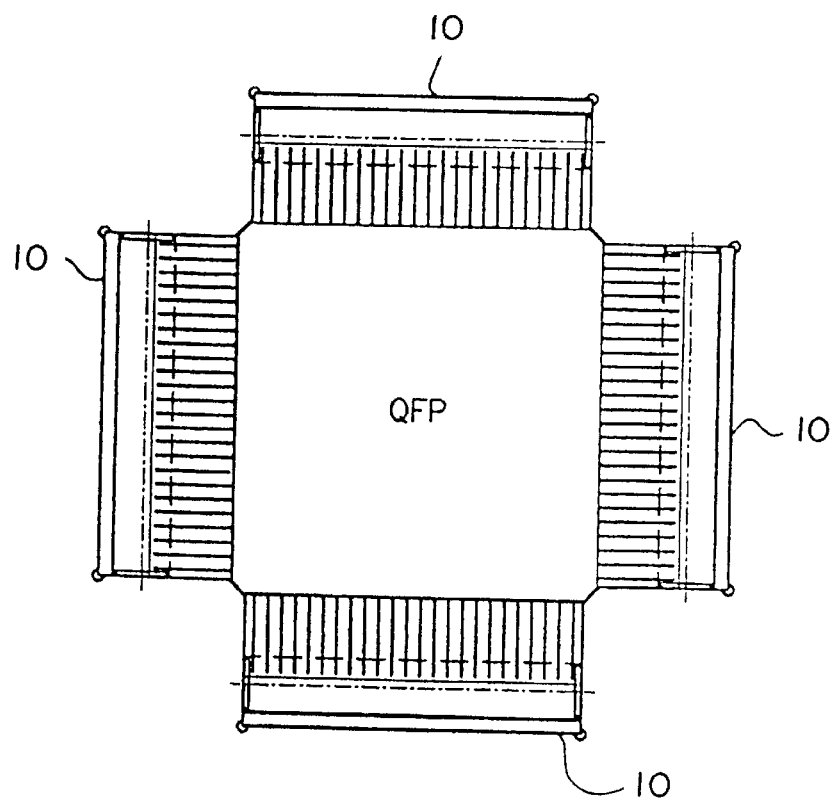
FIG. 13A is a top plan view of the section taken along the line A-A of FIG. 13.

Lastly, FIG. 13 illustrates how the shaftless roller can facilitate an important improvement in the overall lead forming design. As mentioned in the Background section above and illustrated in FIG. 4, the rollers with a shaft could not be used to implement a single stage forming design due to the space occupied by the shaft supports. But as shown in FIG. 13A, the shaftless roller 10 can be made to accommodate all four sides of a QFP because the bulky shaft support is eliminated. Hence, the shaftless rollers makes it possible to implement single stage forming.

It should be apparent from the illustrations that the shaftless rollers can take on multiple embodiments and may be used in a number of ways in lead forming. Many currently available lead forming apparatus which utilize the conventional shafted rollers to form leads on semiconductor devices may be retrofitted with the shaftless roller embodying the present invention and benefit from the advantages of the shaftless design. Hence it should be appreciated by those skilled in the art that various modifications, additions and substitutions are possible for the shaftless roller and the method of using the same, without departing from the scope and spirit of the invention as disclosed in the accompanying claims.

I claim:

1. A shaftless roller for a lead forming apparatus for forming leads on a semiconductor device, said shaftless roller comprising:

a semi-cylindrical cavity disposed in said lead forming apparatus; and a cylindrical rod rotatably fitted into said cavity such that more than fifty percent but less than one hundred percent of said cylindrical rod is inside said cavity, said cylindrical rod being located such that it makes contact with said leads of the semiconductor device, whereby said cylindrical rod facilitates substantially scratch-free lead forming as said leads brush against said rod.

2. The shaftless roller as recited in claim 1 further comprising a plurality of slots leading into said cavity.

3. The shaftless roller as recited in claim 2 further comprising an air passage adapted for delivering pressured air into said cavity.

4. The shaftless roller as recited in claim 1 further comprising an air passage adapted for delivering pressured air into said cavity.

5. The shaftless roller as recited in claim 1 wherein at least some portion of said shaftless roller is made out of friction-reducing material.

6. The shaftless roller as recited in claim 5 wherein said friction-reducing material is ceramic.

7. The shaftless roller as recited in claim 1 wherein approximately sixty percent of said cylindrical rod is disposed inside said semi-cylindrical cavity.

8. A shaftless roller for a cam forming apparatus for forming leads on a semiconductor device, said cam forming apparatus having a cam press for forming said leads, said shaftless roller comprising:

a semi-cylindrical cavity disposed in said cam forming apparatus; and a cylindrical rod rotatably fitted into said cavity such that more than fifty percent but less than one hundred percent of said cylindrical rod is inside said cavity, said cylindrical rod being located such that it makes contact with said leads of the semiconductor device, whereby said cylindrical rod facilitates substantially scratch-free lead forming as said leads brush against said rod.

9. The shaftless roller as recited in claim 8 further comprising a plurality of slots leading into said cavity.

10. The shaftless roller as recited in claim 9 further comprising an air passage adapted for delivering pressured air into said cavity.

11. The shaftless roller as recited in claim 8 further comprising an air passage adapted for delivering pressured air into said cavity.

12. The shaftless roller as recited in claim 8 wherein at least some portion of said shaftless roller is made out of friction-reducing material.

13. The shaftless roller as recited in claim 12 wherein said friction-reducing material is ceramic.

14. A shaftless roller for a lead forming apparatus for forming leads on a semiconductor device, said shaftless roller comprising:

a semi-cylindrical cavity disposed in said lead forming apparatus; and a cylindrical rod rotatably fitted into said cavity such that no more than fifty percent of said cylindrical rod is inside said cavity, said cylindrical rod being located such that it makes contact with said leads of the semiconductor device, whereby said cylindrical rod facilitates substantially scratch-free lead forming as said leads brush against said rod.

15. The shaftless roller as recited in claim 14 further comprising a means for preventing said cylindrical rod from inadvertently falling out of said cavity.

16. A shaftless roller for a pre-forming apparatus for pre-forming leads on a semiconductor device, said shaftless roller comprising:

a semi-cylindrical cavity disposed in said pre-forming apparatus;

a cylindrical rod rotatably fitted into said cavity such that more than fifty percent but less than one hundred percent of said cylindrical rod is inside said cavity, said cylindrical rod being located such that it makes contact with said leads of the semiconductor device;

a plurality of slots leading into said cavity; and an air passage adapted for delivering pressured air into said cavity, whereby said cylindrical rod facilitates substantially scratch-free lead as said leads brush against said rod.

17. A scratch-free method of forming leads on a semiconductor device using a cam forming apparatus, said apparatus having a cam press, a forming die, and a plurality of shaftless rollers strategically disposed in said apparatus, each of said rollers comprising a semi-cylindrical cavity disposed in said cam forming apparatus, and a cylindrical rod rotatably fitted into said cavity such that more than fifty percent but less than one hundred percent of said cylindrical rod is inside said cavity, said method comprising the step of pressing the leads with the cam press until the leads are of a desired shape.

18. A scratch-free method of forming leads on a semiconductor device using a cam forming apparatus, said apparatus having a cam press, a forming die, and a plurality of shaftless rollers strategically disposed in said apparatus, each of said rollers comprising a semi-cylindrical cavity disposed in said cam forming apparatus, and a cylindrical rod rotatably fitted into said cavity such that more than fifty percent but less than one hundred percent of said cylindrical rod is inside said cavity, a plurality of slots leading into said cavity, and an air passage adapted for delivering pressured air into said cavity, said method comprising the step of pressing the leads with the cam press until the leads are of a desired shape.

19. A method of simultaneously forming leads on four sides of a quad flat semiconductor device in a single stage, said method using a cam forming apparatus, said apparatus having four cam presses adapted for simultaneous movement, a plurality of forming dies, and a plurality of shaftless rollers, each of said rollers comprising a semi-cylindrical cavity disposed in said cam forming apparatus, a cylindrical rod rotatably fitted into said cavity such that more than fifty percent but less than one hundred percent of said cylindrical rod is inside said cavity, a plurality of slots leading into said cavity, and an air passage adapted for delivering pressured air into said cavity, said method comprising the step of simultaneously pressing the leads on all four sides of the quad flat semiconductor device with the cam presses until the leads are of a desired shape.

20. A method of pre-forming leads on a semiconductor device using a pre-forming apparatus, said apparatus having a punch press, a forming die, and a plurality of shaftless rollers, said roller including a semi-cylindrical cavity disposed in said pre-forming apparatus, and a cylindrical rod rotatably fitted into said cavity such that more than fifty percent but less than one hundred percent of said cylindrical rod is inside said cavity, said method comprising the step of pressing the leads with the punch press until the leads are of an intermediary shape.

* * * * *